(12) United States Patent
Nielsen

(10) Patent No.: US 12,603,610 B2
(45) Date of Patent: Apr. 14, 2026

(54) OSCILLATOR WITH A MULTIPLE POLE RESONATOR

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 0 days.

(21) Appl. No.: 18/245,135

(22) PCT Filed: Sep. 14, 2021

(86) PCT No.: PCT/CA2021/051284
§ 371 (c)(1),
(2) Date: Mar. 13, 2023

(87) PCT Pub. No.: WO2022/051875
PCT Pub. Date: Mar. 17, 2022

(65) Prior Publication Data
US 2023/0361719 A1      Nov. 9, 2023

Related U.S. Application Data

(60) Provisional application No. 63/078,146, filed on Sep. 14, 2020.

(51) Int. Cl.
*H03B 5/04*      (2006.01)
*H03B 5/12*      (2006.01)
*H03B 5/18*      (2006.01)
*H03H 11/12*      (2006.01)

(52) U.S. Cl.
CPC ............. *H03B 5/1293* (2013.01); *H03B 5/04* (2013.01); *H03B 5/1823* (2013.01); *H03H 11/1204* (2013.01); *H03B 2200/009* (2013.01)

(58) Field of Classification Search
CPC .......... H03B 5/04; H03B 5/1293; H03B 5/18; H03B 5/1823; H03B 5/1829; H03B 5/1864; H03B 5/187; H03B 5/1876; H03B 2200/009; H03H 11/1204; H03H 11/1208
See application file for complete search history.

(56) References Cited

U.S. PATENT DOCUMENTS

| | | | | |
|---|---|---|---|---|
| 4,540,955 A | * | 9/1985 | Fiedziuszko | H03B 5/1817 331/177 R |
| 5,220,686 A | * | 6/1993 | Kasperkovitz | H03H 11/0472 455/240.1 |
| 9,197,221 B2 | * | 11/2015 | Babaie | H03B 5/1215 |
| 10,050,604 B2 | | 8/2018 | Nielsen et al. | |
| 2003/0016090 A1 | * | 1/2003 | Kobayashi | H03B 5/36 331/158 |
| 2006/0061424 A1 | * | 3/2006 | Arigliano | H03B 5/364 331/36 C |
| 2007/0296513 A1 | | 12/2007 | Ruile et al. | |

OTHER PUBLICATIONS

International Search Report and Written Opinion mailed Dec. 10, 2021, issued in corresponding International Application No. PCT/CA2021/051284, filed Sep. 14, 2021, 9 pages.

* cited by examiner

*Primary Examiner* — Levi Gannon
(74) *Attorney, Agent, or Firm* — CHRISTENSEN O'CONNOR JOHNSON KINDNESS PLLC

(57) ABSTRACT
An oscillator has a feedback loop with a signal output, a multi-pole resonator, and a gain block. The gain block applies a gain sufficient to generate a stable oscillation signal at the signal output; and the multi-pole resonator is tunable between two or more resonance modes.

31 Claims, 12 Drawing Sheets

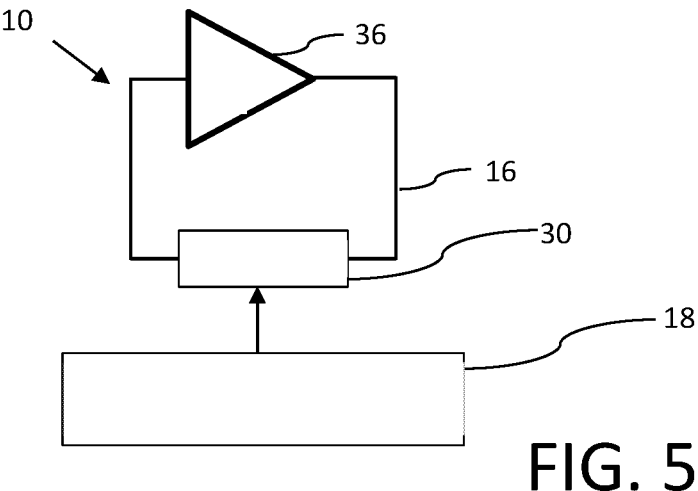
FIG. 5
FIG. 6
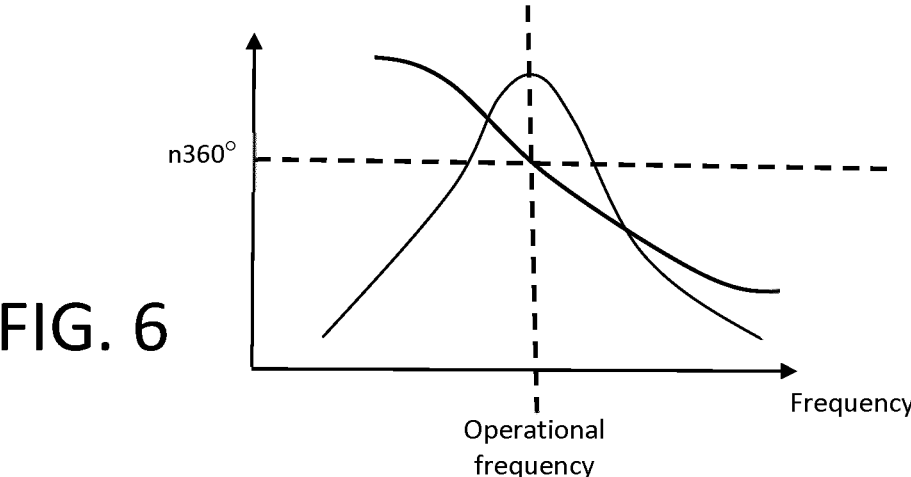
FIG. 7
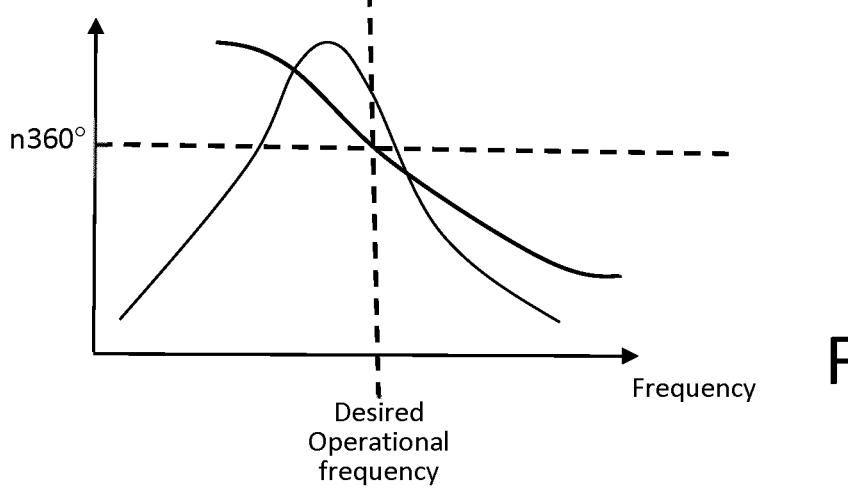

OSCILLATOR WITH A MULTIPLE POLE RESONATOR

TECHNICAL FIELD

This relates to oscillator circuits, and more particularly, to tunable oscillator circuits.

BACKGROUND

Many electronic devices, such as computers and printers, communicate data to each other over wireline or wireless communications links. One component vital to such communications is a generic oscillator, which may be fixed or tunable. Conventional oscillators frequently adjust frequency based on a single control input, such as a voltage-controlled oscillator (VCO) that is adjusted based on a voltage signal. To increase the oscillator tuning range, a voltage-controlled capacitor or varactor may be used.

Each tunable VCO typically has an acceptable level of phase noise over a smaller tuning range. To accommodate a larger range, additional VCOs may be used to maintain a level of phase noise across the range.

In signal processing, phase noise may be described as the frequency-domain representation of random fluctuations in the phase of a waveform, corresponding to time-domain deviations from perfect periodicity ("jitter"). Generally speaking, radio-frequency engineers speak of the phase noise of an oscillator, whereas digital-system engineers tend to work with the jitter of a clock. The effect of phase noise is shown in FIG. 1, where a strong signal is disrupted by a nearby weaker signal because of the phase noise density.

SUMMARY

According to an aspect, a wide tuning range for oscillators, and in particular the voltage controllable oscillator (VCO) may be implemented with multiple-pole resonators (MPR) in a self-oscillation mode. Along with wide tuning range, fundamentally reduced phase noise in a VCO can be realized.

According to certain aspects, there is provided an oscillator with a gain block and a multi-pole resonator (MPR) in a feedback loop wherein the gain is sufficient for sustained stable oscillation. The multi-pole resonator has at least two natural resonance modes. The MPR may have at least one reactance that is variable such that the frequency of oscillation may be varied. The MPR structure may alternate a gain block and a resonator with at least two such sections. The MPR may comprise a variable reactive element such as a varactor and/or a set of switched capacitors. The MPR may be a coupled mode structure with at least one gain block in the loop. There may be an MPR with a plurality of reactive elements that may be individually tuned such that the magnitude of the phase slope of the MPR at the frequency of operation is adjustable up to a maximum. The tunable MPR, such as the reactances, may be optimized for each individual set frequency, and these optimal settings may be stored in a LUT.

According to an aspect, there is provided an oscillator, comprising a feedback loop having a signal output, a multi-pole resonator, and a gain block. The gain block applies a gain sufficient to generate a stable oscillation signal at the signal output and the multi-pole resonator has two or more resonance modes.

According to other aspects, the oscillator may comprise one or more of the following features, alone or in combination: the two or more resonance modes may be tunable, the two or more resonance modes may be voltage-controlled, there may be a controller comprising instructions to tune the two or more resonance modes to achieve a desired oscillation frequency and/or a phase noise of the oscillator; the multi-pole resonator may comprise two or more resonators, each resonator may comprise a varactor or a set of switched capacitors, the oscillator may further comprise more than one gain block, at least one gain block separating adjacent resonators of the two or more of resonators, at least two adjacent resonators of the two or more resonators may be directly coupled; and the gain block may operate in saturation.

According to an aspect, there is provided a method of operating an oscillator as described above, the method comprising the step setting the resonance modes to achieve a desired oscillation frequency, and may comprise the step of tuning the resonance modes to tune the desired oscillation frequency and/or a phase noise of the oscillator.

According to an aspect, there is provided a method of designing an oscillator as described above, comprising the step of selecting a number of resonators to achieve a desired phase noise.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 5 is a schematic diagram of an oscillator with a two port resonator.

FIG. 6 is a plot of the phase and magnitude responses of an oscillator where the phase is a multiple of 360 degrees.

FIG. 7 is a plot of misaligned phase and magnitude responses of an oscillator.

DETAILED DESCRIPTION OF PREFERRED EMBODIMENTS

Figure 1:
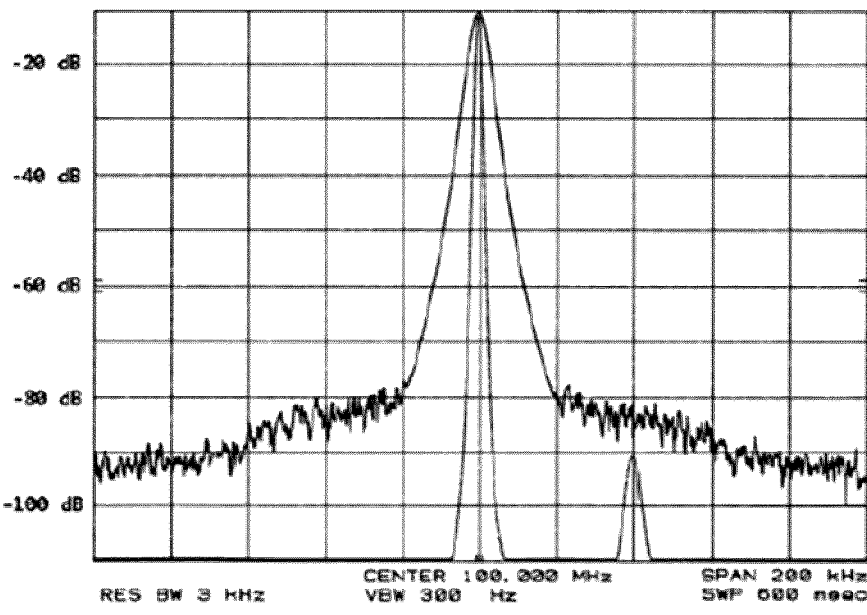
FIG. 1 is a plot of phase noise of strong signal compared to a weak signal.

A tunable oscillator, generally identified by reference numeral 10, will now be described with reference to FIG. 1 through 26.

The discussion below is given primarily in terms of a voltage controlled oscillator (VCO). The discussion also applies to other types of oscillators with more than one resonator, which may or may not be controllable in frequency. For example, the oscillator may be a circuit that outputs an oscillating signal having an oscillation frequency based on a control element and that has more than one resonant frequency modes.

As discussed herein, a multi-pole resonator (MPR) 30 may be used in tunable oscillator 10, such as a VCO. Suitable resonators may include frequency tunable resonators and adjustable scaling blocks connected in a signal loop that allow for control of the frequency, phase, and Q of the variable filter. For example, resonators may include variable or fixed-frequency resonators, LC resonators, or other types of resonators. Some examples of multi-pole resonators will be discussed below. Other examples of multi-pole resonators may be found in U.S. Pat. No. 10,050,604 (Nielsen et al.) entitled "Variable Filter", incorporated herein by reference.

MPR Resonator as a Linear Filter in the Left-Hand Side of the s-Plane

In general, oscillators may be considered to operate on the right-hand side of the s-plane (RHP), or very near the jω axis, while a filter typically operates on the left-hand side of the s-plane (LHP).

Figure 2:
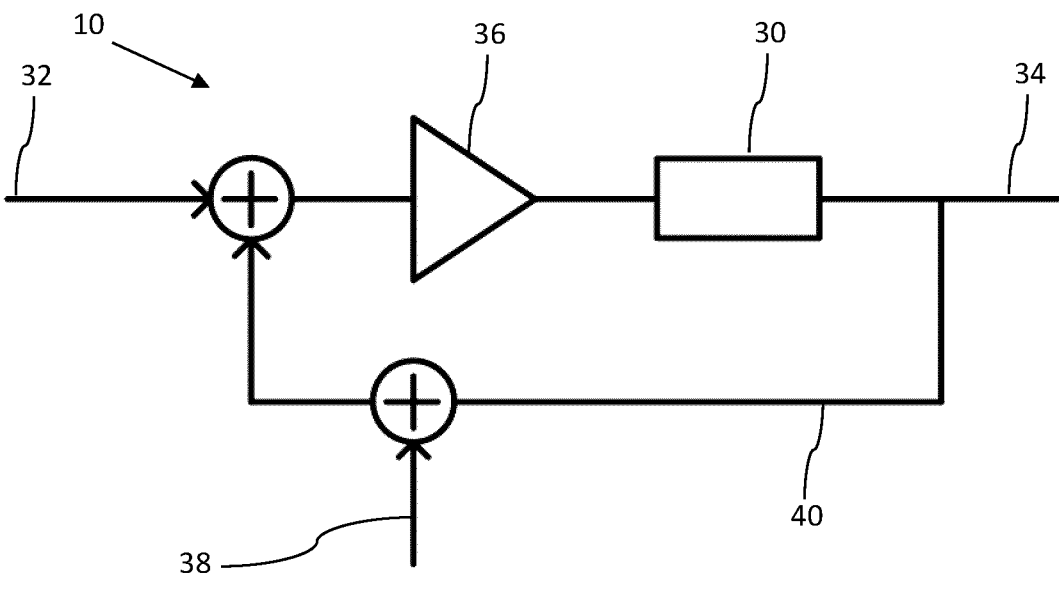
FIG. 2 is a schematic diagram of a signal loop that contains a multi-pole resonator.

Referring to FIG. 2, a variable filter based on an MPR 30 operating in the LHP is shown with an input signal 32, a gain block 36, a noise signal 38, an output signal 34, and a signal loop 40 between input signal 32 and output signal 34. The noise may be represented by a noise signal 38 added at one point and is the equivalent noise of the various components within the MPR loop 40 primarily coming from gain block 36. The noise, having a signal function $S_n(t)$, is typically considered to be wide band noise in that over the Q enhanced bandwidth of MPR 30, $S_n(t)$ is spectrally flat with a power spectral density (PSD) of kTF where k is Boltzmann constant, T is absolute temperature, and F is the effective noise figure of the components in loop 40.

The output signal may then have a power spectral density represented as:

$$S_o(f) = \text{PSD}(s_o(t)) = (kTF + S_i(f))|H_{CL}(f)|^2$$

where $H_{CL}$ (f) is the closed loop transfer function of the MPR 30. Hence if the input signal is removed, then there is a residual output PSD of the noise that is subjected to the gain of $H_{CL}$ (f). Typically the MRP 30 when used as a linear filter in the LHP will have a Q of between 100 and 5000.

MPR Resonator as an Oscillator in the Right-Hand Side of the s-Plane

Figure 3:
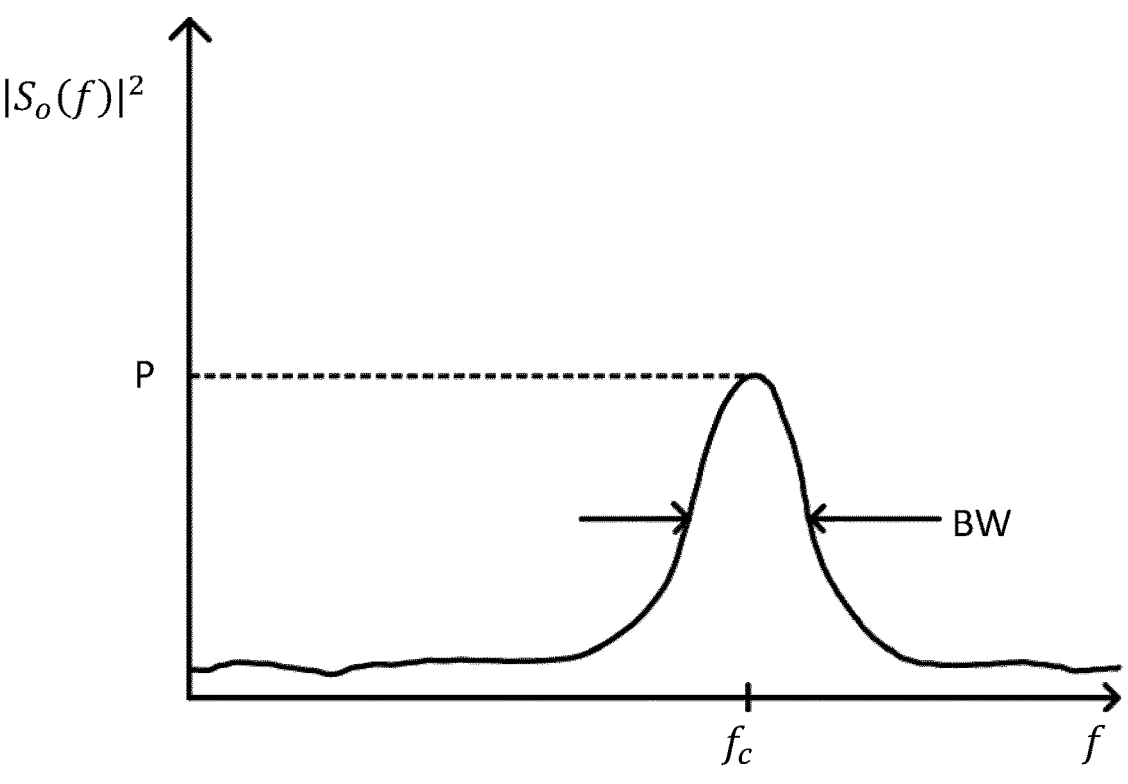
FIG. 3 is an example of a power spectral density plot of the multipole resonator of FIG. 2.

Considering now the VCO function where the input of $s_i(t)$ is removed results in an output generated by the noise term $S_o(f) = kTF|H_{CL}$ (f)$|^2$ as sketched in FIG. 3. This output is centered at $f_c$ which is the center frequency of the MRP based LHP filter, with a bandwidth (BW) that is equal to the bandwidth of the filter. The power level P corresponds typically to −100 dBm/Hz when the gain block (G<1) provides a Q enhancement of about 1000. The operation of the RHP resonator may be controlled by an external setting of the loop gain block 36.

Figure 4:
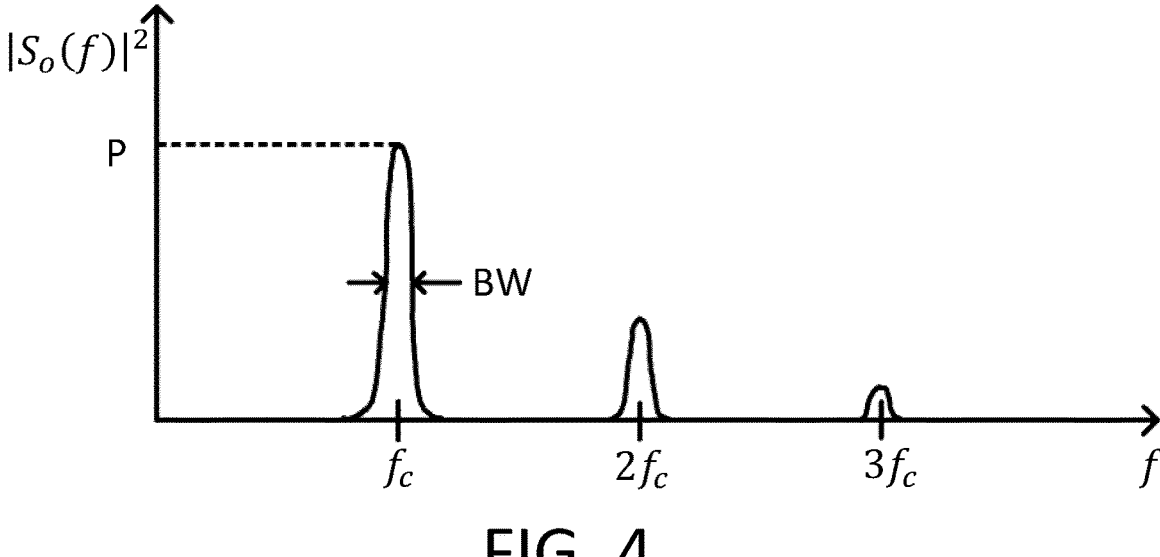
FIG. 4 is an example of a power spectral density plot the multipole resonator of FIG. 2 that is gain saturated.

As the loop gain is increased towards 1 with no signal input but the noise present, the Q will become very large (for example >10$^6$) and the BW will be narrowed, such as to a few Hertz. The gain applied to the noise may become so large that the amplitude of the output signal may saturate the gain block 36. This will effectively limit the loop gain of the resonator to less than, but close to, unity. An example output spectrum may be as shown in FIG. 4, which corresponds to a sinusoidal signal with a BW of a few hertz with some harmonic distortion terms. The power level P of the fundamental component may be around 0 dBm.

The level of the harmonics of $S_o(f)$ may depend on the saturation characteristics of the gain block or other components in the loop of the MPR. For soft saturation, these harmonics may be at a low amplitude, while for hard saturation the harmonics may have a power high level approaching that of the fundamental at $f_c$.

In contrast, for the oscillator function with the MPR pole in the RHP, the initial loop gain is set such that G is greater than unity, after which there may be no gain control. The oscillator amplitude builds up exponentially with time until the gain block begins to soft saturate, which internally reduces the gain such that the amplitude reaches a steady state level and the loop gain settles to a value slightly less than unity. The operational gain value in the RHP may be set by the oscillator circuit itself without an external control element for gain block 36 of FIG. 2.

An oscillator may operate with the gain block 36 in soft saturation, with the loop gain just slightly below unity. An oscillator may also operate with the gain block 36 in hard saturation, in which case the loop gain is set above unity. Initially, the loop gain of the oscillator will be greater than unity and will typically change as the gain block becomes saturated.

The MRP in this soft saturated amplitude mode behaves as an oscillator with an MPR in the feedback loop. As there is no input signal, the loop sum block of FIG. 2 may be removed.

Since phase noise is as integral part of the net VCO circuit, issues related to phase noise as the VCO oscillator is tuned over a broad frequency range will now be discussed, followed by a more detailed discussion of phase noise.

Oscillator as a Single Pole Resonator

Referring to FIG. 5, oscillator 12 may be represented equivalently as a two-port resonator 30 in a feedback loop 16 as shown in FIG. 5. Oscillator 12 in the depicted example may be a VCO with a resonator 30 based on a varactor diode such that a frequency control 18 may be applied using a varactor diode bias. Other oscillator 12 models may be represented in an analogous form with separate gain 36 and resonator 30 blocks.

The oscillation condition is that the loop gain g is unity and the phase shift around loop 16 is a multiple of 360 degrees. That is, the frequency of oscillation will correspond to a loop phase shift of n360° where n is 1,2,3 . . . and the loop gain will be pushed by soft compression to a value that slightly less than unity. The amount less than unity depends on the ratio of the oscillator signal output amplitude to the rms amplitude of the noise that is initially driving the oscillator within the Q enhanced bandwidth.

A preferred design objective of oscillator 12 is to have resonator 30 response peak at the same frequency at which the phase shift around the loop is a multiple of 360 degrees. This leads to a reduced sideband noise, which is directly related to the oscillator phase noise. If this design objective is not met, such as due to parasitic signal transport delays and reactive components within the loop resulting in frequency dependent phase shifts, the oscillator may still operate but the phase noise may deteriorate, and the oscillation frequency may not be stable.

For a fixed frequency oscillator, these loop parasitic elements may be modelled and compensated for in the circuit design. A tunable oscillator, however, may be a more difficult design. There are limitations in the variables of design that may be used for compensation. This ultimately limits the practical tuning range that may be achieved. The desired implementation of the oscillator loop design is illustrated in FIG. 6. Here, the peak magnitude of the open loop magnitude response 61 is coincident with the open loop phase response 63 passing through n360 degrees.

Due to the drop off of the magnitude open loop response on either side of the resonance, the sideband spectral noise, denoted as L(Δω), will monotonically drop off with offset frequency of Δω. However, in the tunable oscillator design this may be difficult to achieve across the tunable band. There may be misalignments, as illustrated in FIG. 7 by open loop magnitude response 71 and open loop phase response 73, that occur in the extremes of the tuning band.

The oscillator will only initiate oscillation if the loop gain exceeds unity at the n360° phase frequency. Assuming this, the oscillation will build up until soft saturation sets in and the oscillator stabilizes. However, as shown in FIG. 7, the higher gain at the lower frequency can significantly add to the sideband phase noise in this region. That is, L(Δω) will not decrease monotonically with Aw. If the frequency misalignment is severe then the oscillator may exhibit sporadic time domain instabilities at frequencies other than the desired operational frequency.

Oscillator Frequency and Phase Alignment Using the Multi-Pole Feedback

Using a resonator with more than one pole, it is possible to create a flat signal amplitude response resulting from the magnitude response of the feedback. Hence if there is any phase misalignment due to parasitic reactive elements in the open loop, seen in FIG. 7, then it may be possible to avoid excess phase noise. The other advantage is that the operating point may be more stable with the flat open loop magnitude response over a particular frequency range compared to that of the single pole resonator. An advantage of the multi-pole resonator is that the phase noise may not drop off as quickly with Aw as in the aligned oscillator of FIG. 6.

Figure 8:
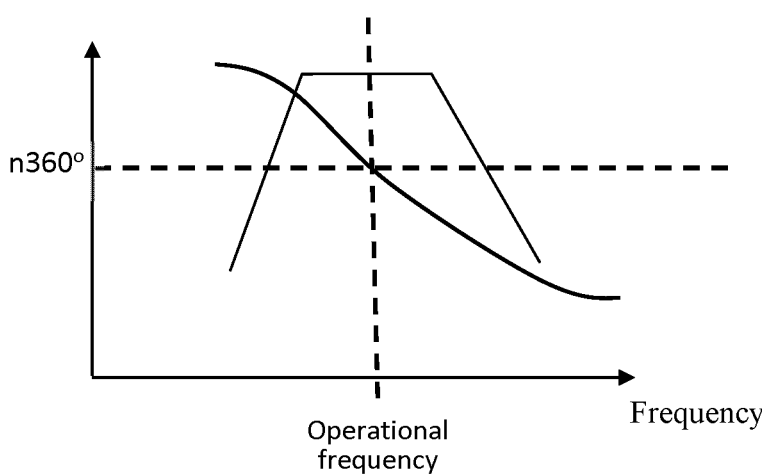
FIG. 8 is a plot of the phase and magnitude response for a multi pole resonator with a flat passband response.

FIG. 8 illustrates the magnitude response 81 and phase response 83 of an idealized multi-pole resonator that may be designed for a flat passband and sharper drop-off. The benefit of the flatter passband is that the feedback loop may be more frequency stable and tolerant to phase changes that occur due to uncontrollable parasitic reactive components over the tuning range.

Figure 9:
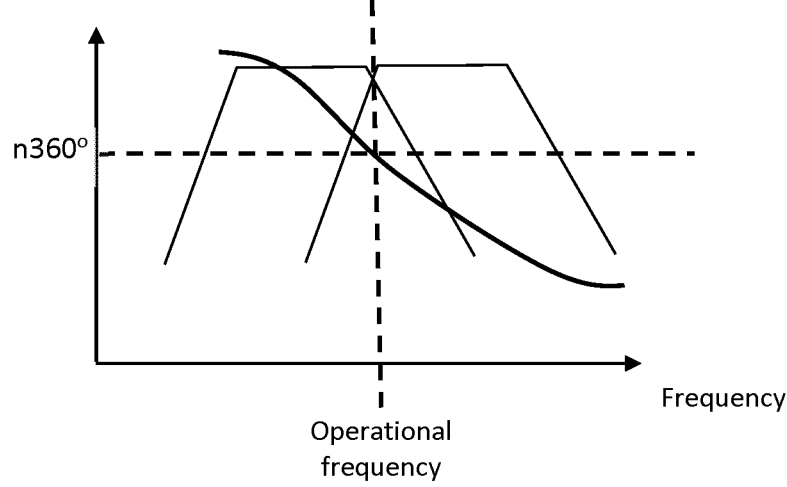
FIG. 9 is a plot of the phase and magnitude response for a multi pole resonator with a flat passband response showing a wide tuning range.

A more phase tolerant feedback resonator implementation may be important in the design of tunable oscillators with a wider tuning range. In principle, the single pole response of FIG. 5 may be attained for all of the frequencies within the range of tuning of the varactor capacitor. However, in practical implementations, the open loop may misalign at the extremes of the tuning range limiting the tunability to less than the range afforded by the varactor. FIG. 9 illustrates the tolerance of the open loop phase error that may be tolerated without the penalty of incurring excess phase noise, where line 91a and 91b are the open loop magnitude multi-pole response, and line 93 is the open loop phase response. The phase noise effects will be discussed in more detail below.

Implementation of a Multi-Pole Feedback Resonator

Figure 10:
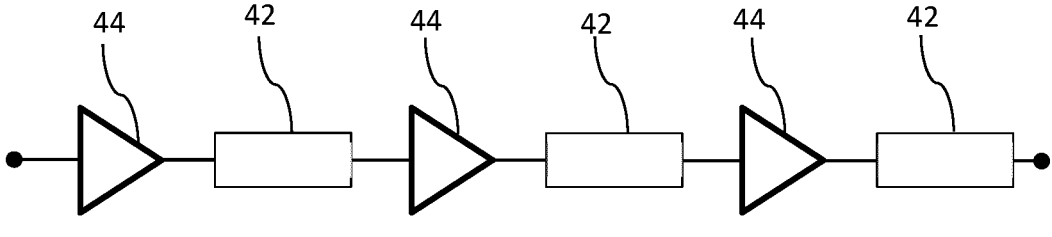
FIG. 10 is a schematic diagram of three pole resonator with buffers between each resonator.

There are a variety of implementations of multi-pole resonator 30 that may be suitable for use in a feedback circuit to be used as an oscillator. One example includes several single pole resonators 42 in series as shown in FIG. 10. Here, single pole resonators 42 may be isolated from each other with buffer amplifiers 44. Each single pole resonator 42 may be a single LC tank and may be tuned to a slightly different pole location to provide the flat passband response shown in FIG. 8.

Figure 11:
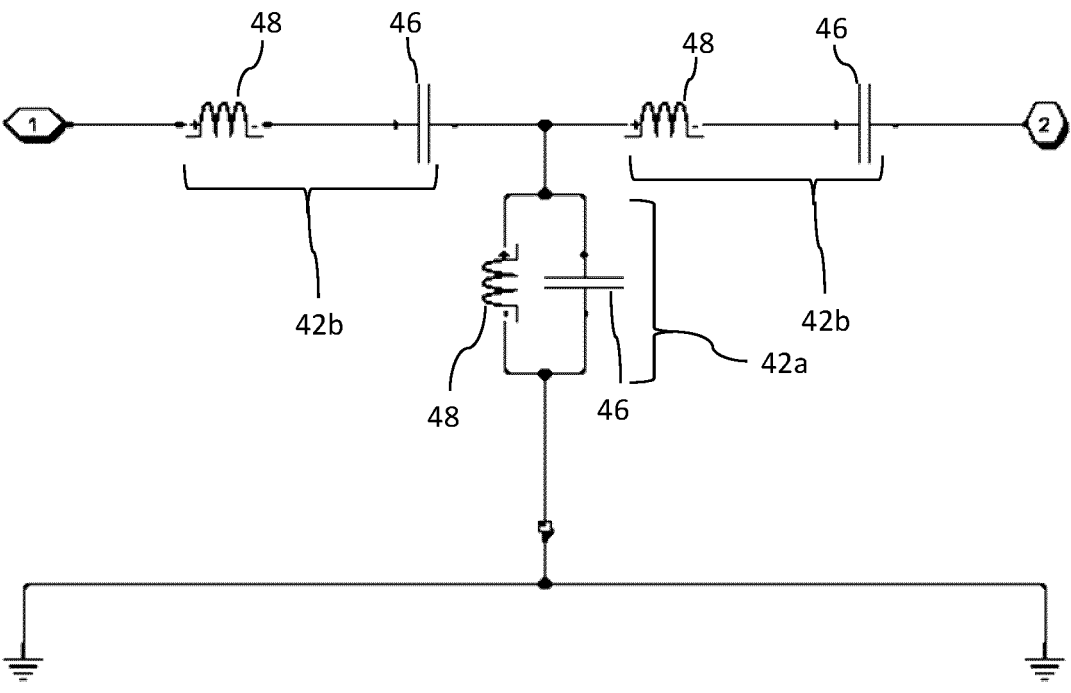
FIG. 11 is a schematic diagram of an example of a low loss multipole resonator using three resonators.

Referring to FIG. 11, another example is a third order network of coupled resonators, typically LC resonators with pairings of capacitors 46 and inductors 48. The parallel resonators 42a and series resonators 42b may be configured such that the poles realized are spaced such that they provide the desired flat amplitude response as in FIG. 8. The advantage of the structure depicted in FIG. 11 is that it may be designed as a low loss network without buffer amplifiers 44 between individual resonators 42, such as tank resonators as in the examples discussed below.

Figure 12:
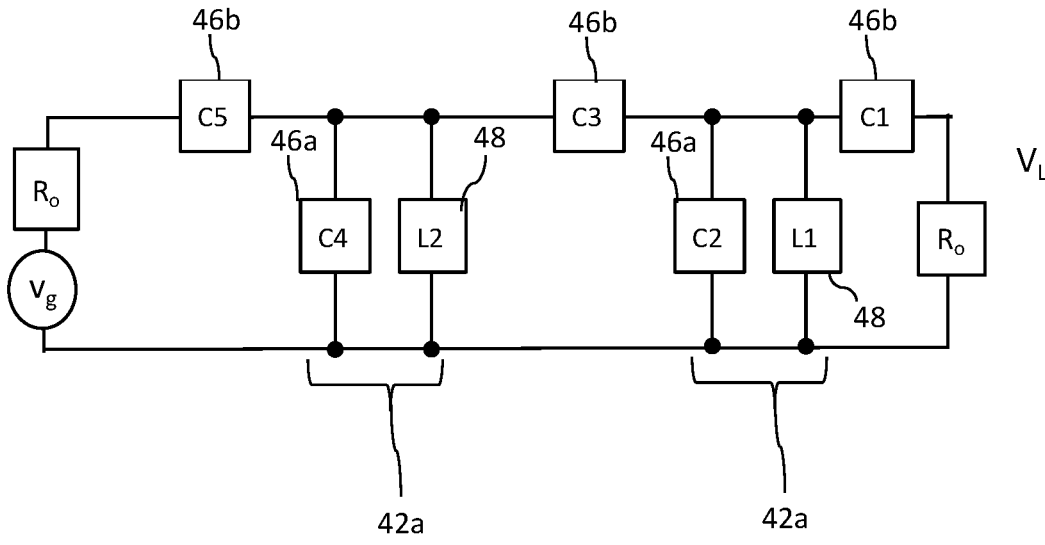
FIG. 12 is a schematic diagram of an example of a low loss multipole resonator using two resonators.

Referring to FIG. 12, another example is a coupled two-tank resonator circuit with {L2,C4} and {C2,L1} forming two parallel resonators 42a. The two-pole resonator 30 as in FIG. 12 may provide the lowest complexity of the examples presented herein while achieving a reasonably flat passband over a relatively large frequency range such that the phase tolerance described briefly above, and in detail later, is achieved.

For a tunable resonator 30, shunt capacitors 46a (e.g. C2 and C4) in parallel resonators 42a may be tunable, and may be based on varactor diodes. Coupling capacitors 46b (e.g. C1, C3 and C5) may not be tunable, but may be selected to provide the best composite performance or resonator 30 over the desired tuning band.

As an example of how the two poles of resonator 30 are coupled, consider the symmetric implementation where $$\omega_o = \frac{1}{\sqrt{C4L2}} = \frac{1}{\sqrt{C2L1}}$$

Figure 13:
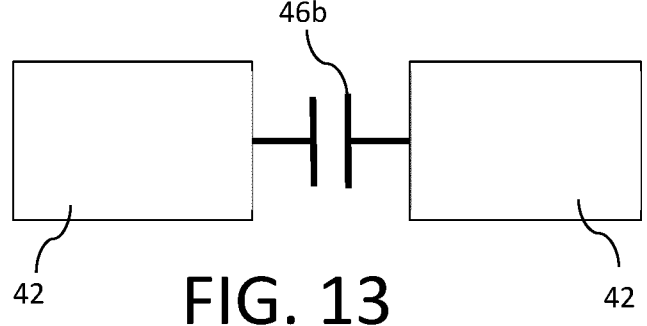
FIG. 13 is a schematic diagram of a multipole resonator with a symmetric two tank design around a coupling capacitor.

For the present, consider C3 as the coupling and ignore the rest of the circuit. Then the symmetric coupled resonator is as shown in FIG. 13.

From the symmetry, there are two modes.

1. The even mode where the two tank resonators oscillate in phase and the same amplitude and hence no current flows through C3. The resulting pole is at the frequency of $\omega_0$.

2. An odd mode is where the two tanks are in anti-phase and hence this is equivalent to the two tanks with an added parallel capacitance of 2C3 in parallel, and the pole frequency at $$\omega_o = \frac{1}{\sqrt{(C4 + 2C3)L2}} = \frac{1}{\sqrt{(C2 + 2C3)L1}}$$

To place the poles relatively close in frequency, C3 should be small relative to C2 or C4. However, as the Q of the load and source resistors is added in, and the integrated Q of the resonator tanks is modest, the even and odd poles may be moderately separated and still achieve a relatively flat frequency response.

Resonance Energy Exchange Considerations for Resonator Versus Oscillator

When the resonator is driven at an arbitrary frequency, such as between the two mode poles, then in the individual pole resonance there may not be a complete exchange of magnetic and electric energy and the pole may appear as a capacitive load if the drive frequency is above the pole frequency, and as an inductive load if the drive frequency is below the pole frequency. However, if the resonator is used in an oscillator loop, then the phase of the overall open loop may be zero.

Phase Noise Reduction Using Multi-Pole Resonator Structure in a VCO

There will now be given a detailed analysis of the phase noise of the VCO based on multiple resonators. Methods are used wherein a quantitative comparison of phase noise is possible between the conventional oscillator based on a single pole resonator (SPR) and a multi-pole resonator (MPR). As discussed, the MPR may enhance the tuning range of an oscillator, such as a VCO. In addition, the additional MPR may reduce the VCO phase noise.

Phase noise analysis is complex but may be simplified based on using Leeson's model, which is generally accepted by industry for its accuracy. However, as Leeson's model is derived for SPR oscillators with a specific resonator Q factor, a potential problem may exist in applying this to MPR oscillators.

An equivalent resonator Q based on the aggregate of the resonator poles may be considered. However, instead of the explicit Q factor, it may be generalized back to the energy storage in the entire feedback loop with the losses thereof considered. This then gives at a point in the feedback loop a carrier signal level that is related to the energy storage to the power dissipated.

Conceptually, phase noise in oscillators may be relatively straight forward. There are various noise sources throughout the components comprising the oscillator circuit that contribute flicker and thermal noise that may be mapped to the output port based on some assumptions of statistical independence. Then the composite phase noise may be calculated and presented as a power spectral density relative to the carrier. The RF system designer may then calculate the effect of the phase noise on the overall signal processing. However, a problem for oscillators is that the noise sources driving the phase and amplitude noise of the output also are generally the noise that generates the carrier. As such the oscillator may be nonlinear with an output that results from a highly amplified random process.

Leeson's Phase Noise Formulation

Figure 14:
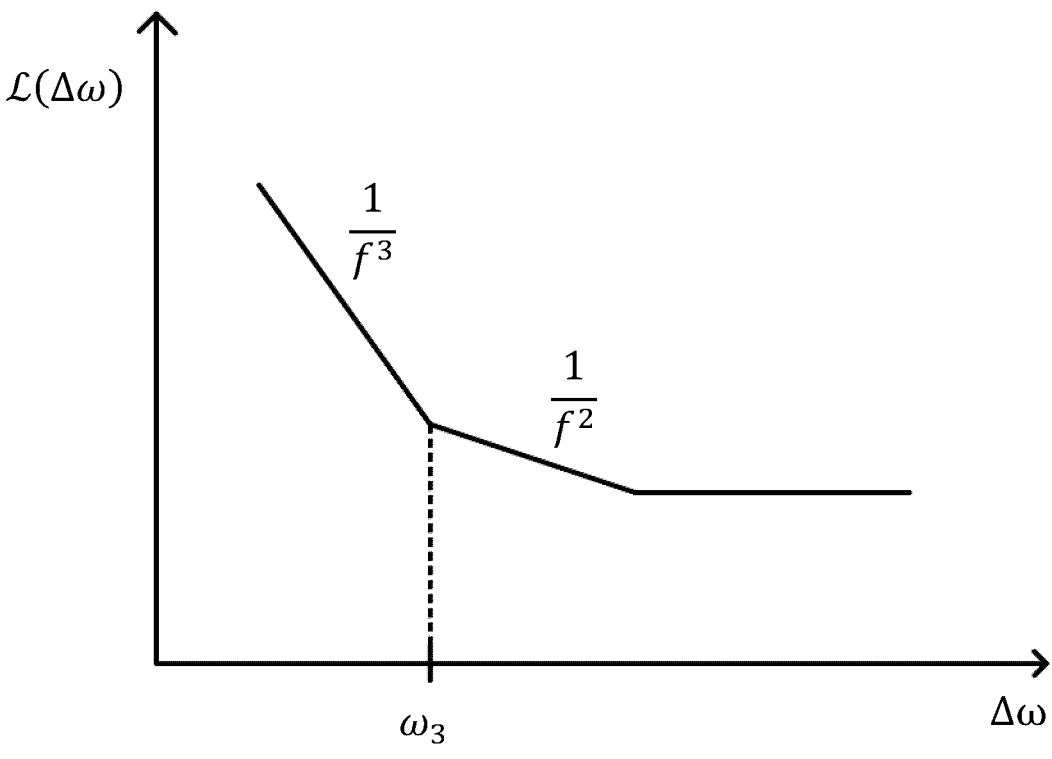
FIG. 14 is an example of a plot of phase noise plotted as spectral density.

A common standard in this regard is Leeson's phase noise formulation, which may be expressed as $$\mathcal{L}(\Delta\omega) = 10\log\left(\frac{2FkT}{P_c}\left(1 + \left(\frac{\omega_o}{2Q\Delta\omega}\right)^2\right)\left(1 + \frac{\omega_3}{\Delta\omega}\right)\right)$$

where $\mathcal{L}(\Delta\omega)$ is the sideband phase noise in dBc/Hz at an offset of the carrier of $\Delta\omega$, and F is the equivalent noise figure (NF) of the loop components, typically dominated by the noise of the active gain device used in the feedback loop or the negative resistance device. In practice, the NF of the overall loop may be difficult to determine as there are several partially correlated noise sources and the loop operation is nonlinear. k is the Boltzmann constant, T is absolute temperature, $P_c$ is the signal power of the oscillator, $\omega_0$ is the frequency of oscillation, Q is the loaded Q of the SPR, and $\omega_3$ is the transition between the $f^{-3}$ region and the $f^{-2}$ region which is close to the carrier. A sketch of the phase noise may be as shown in FIG. 14.

The utility of Leeson's model is that for generic oscillators of reasonable quality, it provides a reasonably accurate description with few parameters. It also emphasizes the dependence of the Q of the SPR. The disadvantage is that the parameters of F and $\omega_3$ are determined by measurement. Hence the phase noise model is fitted to the measured phase noise. F is the equivalent noise figure of the active gain element and is difficult to determine due to both the feedback and the nonlinearity of the device. It may be different for every oscillator configuration. Also, $\omega_3$ may not be the 1/f corner frequency of the active device but may only be related to it.

For these reasons the complete Leeson' model for phase noise may not be sufficient alone in making a comparison between the SPR and MPR. However, the $f^{-2}$ component of Leeson's is directly derivable from first principles with reasonable assumptions in a way that is applicable to the MPR. This will be derived herein and will subsequently be used as a basis of the comparison.

The $f^{-2}$ term of $$\frac{2FkT}{P_c}\left(\frac{\omega_o}{2Q\Delta\omega}\right)^2$$

notwithstanding $\underline{F}$, is otherwise well defined. The dependence of Q, in the range where the $f^{-2}$ term dominates, is important for oscillator design. This explains the importance of achieving the highest reasonable Q of the loaded SPR.

Developing Equivalency of Leeson's Phase Noise Relationship for the Multi-Pole Resonator (MPR)

Figure 15:
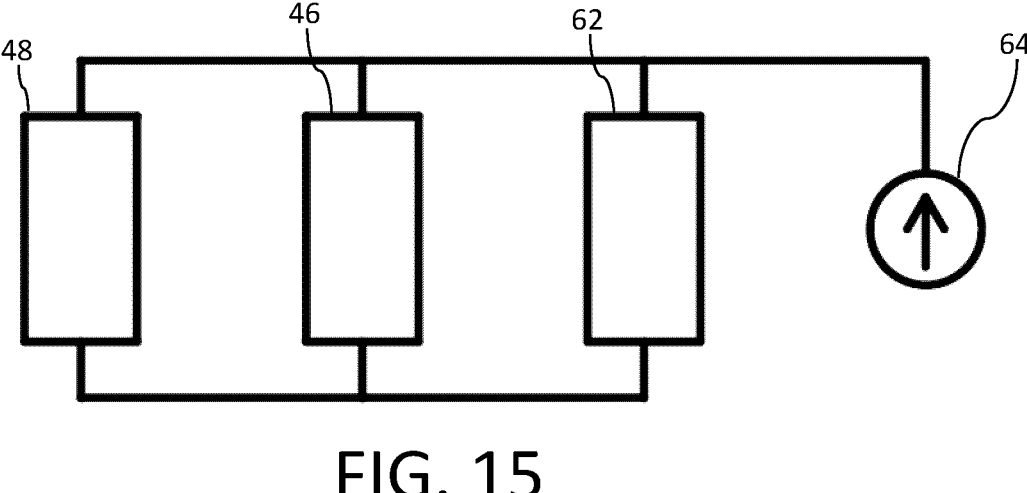
FIG. 15 is schematic diagram of a parallel single pole resonator with a current noise source that is related to a conductance in the circuit.

As a start, consider the phase noise of a parallel SPR 60 with a capacitor 46 and inductor 48 as in FIG. 15. The current noise source, represented by $$i_n^2 = 4kTG\Delta f$$

is due to the conductance 62, which has a value of G, representing the loss of the SPR. In an active oscillator 12 this G is reduced to near zero with a −G of an active source 64 but this carries an additional noise source and hence the F in Leeson's. F is omitted in the idealized model considered here in the noise current source but will be discussed later.

However, not yet shown is the feedback Q enhancement that injects an additional feedback current that compensates for G with an equivalent negative conductance. This active feedback will have a noise figure F term associated with it. In the derivation of the $f^{-2}$ term, F enters the noise component, but not the carrier component as this is specified directly as a power $P_c$. This is necessary as $P_c$ is highly sensitive to the details of the nonlinear gain saturation of the oscillator and is therefore poorly defined. However, $P_c$ is in itself a well-defined oscillator parameter that is of significance in comparisons as $P_c$ is directly related to the overall power consumption of the oscillator. G is compensated by an active feedback such that it can be removed from the circuit which is the Q enhancement of the oscillator circuit. However, the current noise source is still present and is fed into the LC resonator.

The impedance of the LC resonator at an offset frequency of $\Delta\omega$ from resonance becomes $$Z(\omega_0 + \Delta\omega) \approx -j\frac{\omega_0^2 L}{2\Delta\omega}$$

Next, the Q of the SPR may be written as $Q=1/\omega_0\, GL$ and hence $$|Z(\omega_0 + \Delta\omega)| = \frac{(\omega_0^2 LG)\omega_0}{2G\Delta\omega}$$

The IEEE defines phase noise as $\mathcal{L}(f)=S\varphi(f)/2$ where the "phase instability" $S\varphi(f)$ is the one-sided spectral density of a signal's phase deviation. Thus, the single sideband phase noise becomes $$\mathcal{L}(\Delta\omega) = 10\log\left(\frac{1}{2}\frac{(\text{noise voltage at }\Delta\omega)^2}{(\text{carrier voltage})^2}\right)$$

The factor of ½ recognizes that typically half the noise is considered to be amplitude variations (which are normalized out in an oscillator) and half is phase noise.

This results in $$(\Delta\omega) = 10\log\left(\frac{1}{2}\frac{4kTG\omega_o^2/Q^2 4G^2\Delta\omega^2}{P_c/G}\right)$$

which simplifies to $$\mathcal{L}(\Delta\omega) = 10\log\left(\frac{kT}{2P_c}\frac{\omega_o^2}{Q^2\Delta\omega^2}\right)$$

This is Leeson's phase noise relationship for the $f^{-2}$ region. Note that $\Delta f=1$ Hz.

The reason for including this derivation is to highlight the connection to Q that comes in when the impedance of the resonator (with feedback such that the conductance G is cancelled) is approximated around resonance. This is done with the substitution of as $Q=1/\omega_0 GL$ as before.

It may also be noted that the noise from the conductance G includes both the signal and the sideband noise from which the phase noise is derived.

Figure 16:
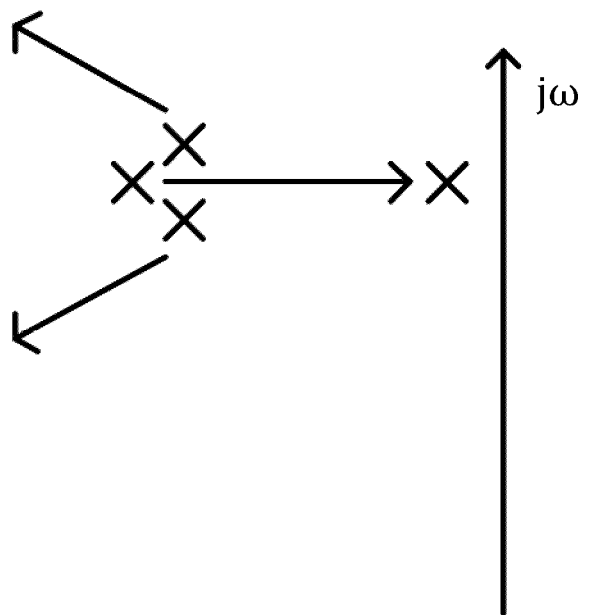
FIG. 16 is an example of a plot of the root locus of the Q enhancement of the dominant pole of the multi pole resonator.
Figure 17:
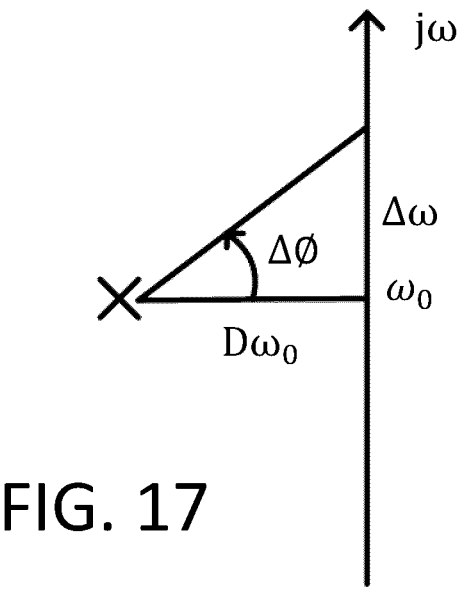
FIG. 17 is an example of a plot of the root locus of a pole showing the relation to the phase change and frequency offset.

Now consider an oscillator that uses the MPR in an active feedback loop. Similar to the SPR, the MPR has an input impedance for the loop when the losses are compensated for. Note that when the MPR is Q enhanced, the dominant pole is moved by the feedback to a closed loop pole that is closer to the jw axis while adjacent poles move in the opposite s-plane direction. With this, there is an equivalent L, C and the $\omega_0$ of the resonance. This is illustrated in FIG. 16, where the "X" represent the poles of an MPR, and the arrows represent the Q-enhanced root locus. A difference is that instead of a single loss of a conductance across the SPR, in the MPR the individual loss components and their associated noise sources should be considered and added to the loop.

Summarizing, the Leeson model derived for a SPR resulting in Q in the expression for the $f^{-2}$ term, is not directly applicable to the MPR as the notion of Q for the SPR does not translate directly to the MPR. However, as illustrated in FIG. 16, the Q enhanced MPR has a single dominant pole, with the movement adjacent poles dictated by the dominant pole, and behaves in some ways as an SPR. An equivalent replacement for Q may be used that is the open loop transfer function phase slope, which will be described below.

Instead of assigning an equivalent Q to the pole that is Q enhanced, Q may be considered in terms of the phase variation. Consider FIG. 17 of the single dominant pole. For simplicity assume that the pole can be Q enhanced to a corresponding oscillation frequency of $\omega_0$. Prior to Q enhancement, the damping is D and Q may be given as $Q=½D$

Generalized Phase Noise Slope of the Leeson f−2 Region for Multi-Pole Oscillator The relation between the phase slope with offset frequency and the Q may be given as $$\frac{d\phi}{d\omega} = \frac{2Q}{\omega_o}$$

Hence this suggests a substitution for Q as $$Q = \frac{\omega_o}{2}\left|\frac{d\phi}{d\omega}\right|$$

Hence the phase noise relation may be expressed for the $f^{-2}$ region as $$\mathcal{L}(\Delta\omega) = 10\log\left(\frac{kT}{2P_c}\frac{\omega_o^2}{\left(\frac{\omega_o}{2}\left|\frac{d\phi}{d\omega}\right|\right)^2\Delta\omega^2}\right) = 10\log\left(\frac{kT}{P_c}\frac{2}{\left|\frac{d\phi}{d\omega}\right|^2\Delta\omega^2}\right)$$

This may be considered a reasonable approach in that the steeper the phase variation around resonance, the lower the phase noise. The dependence of phase noise on $$\frac{d\phi}{d\omega},$$

the change in phase versus frequency, or phase slope, goes deeper in that it is related to the energy storage of the resonator which relates back to Q. The higher the energy storage, the faster the change of resonator reactance with frequency which relates back to $$\frac{d\phi}{d\omega}$$

again. Note that the phase slope dependence $\mathcal{L}(\Delta\omega)$ is a general method of characterizing the resonator and is not constrained by the structure. It may be an SPR 60, an MPR 30, a delay line, a distributed field cavity resonator and so forth.

Figure 18:
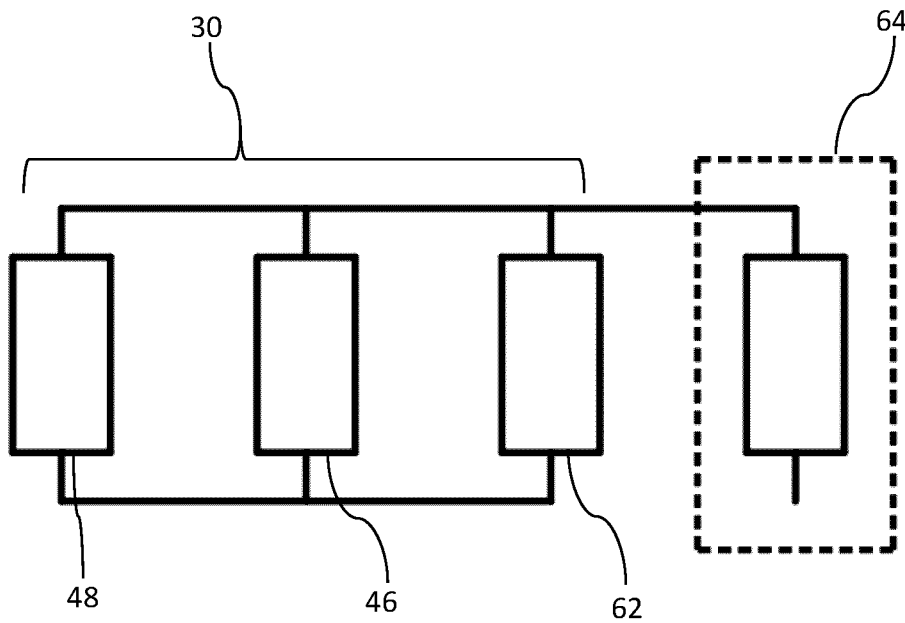
FIG. 18 is schematic diagram of a single port resonator.

The phase slope is a more general method. There may be considered either a one port resonator 30*a* as in FIG. 18 or a two-port resonator 30 as in FIG. 19. Referring to FIG. 18, for the one port resonator 30*a*, the incident signal and the reflected signal may be separate and therefore associated with a phase shift. This will be considered below.

Figure 19:
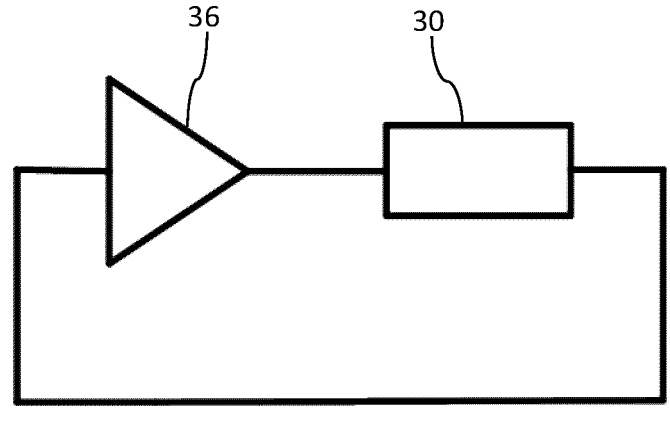
FIG. 19 is a schematic diagram of a two-port resonator.
Figure 20A:
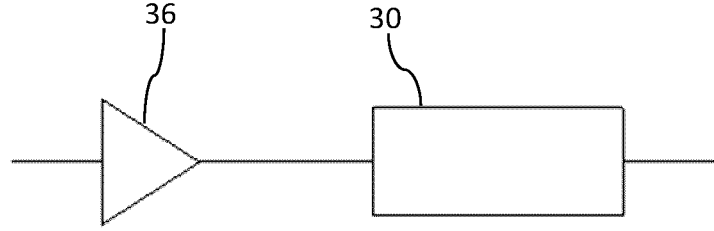
FIG. 20*a* is a schematic diagram of the gain block and resonator of an oscillator.
Figure 20B:
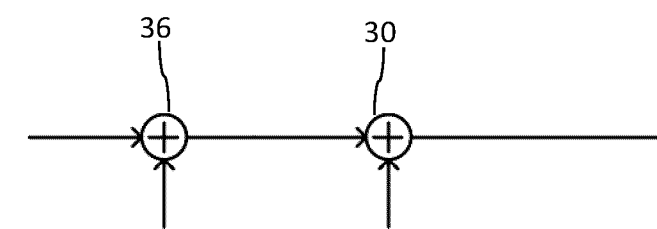
FIG. 20*b* is a diagram of the calculation of the overall noise of the circuit in FIG. 20*a*.

Now consider this as an equivalent two port resonator 30*b* as in FIG. 19. The gain block 36 may be a form of transimpedance amplifier that senses the output voltage of the resonator and injects a current into the resonator which is equivalent of the negative conductance 36*a* in FIG. 18.

Practical Comparison of Phase Noise Reduction with Implementation of an MPR

Absolute assessments of the phase noise of the MPR with n poles when operated in self oscillation mode (SOM) may be difficult and may require extensive detailed simulation of the nonlinear saturation of the gain block and resonator varactor diodes. A much simpler approach is that of a comparison: given an oscillator feedback based on an SPR, and then add an additional pole, what will the change in the phase noise be? Such comparisons may support the improved phase noise performance of the MPR in SOM. What is proposed is a comparison of phase noise of different oscillator configurations. Specifically, the phase noise comparison may be based on the offset frequency region where $\mathcal{L}(\Delta\omega)$ varies as $V\Delta\omega^2$.

In this example, consider an oscillator loop composed of a gain block and a resonator. The overall loop gain is unity at the oscillation condition such that gain block compensates for the losses in the delay line.

Now suppose that the gain block 36 gain is g and therefore the resonator 30 loss is Loss=1/g. In calculating the phase noise, it may be easiest to bring the noise terms to the front of the loop as in FIGS. 20*a* and 20*b*. Consider a gain g followed by a resonator loss of L. With the overall gain being unity, we have L=1/g. The gain block has a Noise Figure of F and the Noise Figure of the resonator is g, based on two assumptions:

1. The overall loop gain in an oscillator is very close to unity;
2. In a typical implementation the resonator would be at approximately room temperature. Hence the loss of the resonator must equal the gain applied by the scaling block.

The total noise equivalent at the input may be expressed as a sum of the two noise inputs 202 and 204, as follows:

$$\text{Input Noise Equivalent} = (F-1)kT + \left(\frac{g-1}{g}\right)kT$$

12

For a lossless delay line, the noise is (F−1)kT and for a very lossy delay line, such that g is large, the delay line noise is approximately FkT. Assuming large g, the equivalent input phase noise into the loop becomes (F+1)kT and the feedback signal flowing in the loop is $P_c$. It is important that $P_c$ and the phase noise are compared at the same point. But note that $gP_c$ is needed at the output of the gain block which is of course the point of soft saturation.

If the increase in phase noise slope is greater than the increase in loss, then a better oscillator emerges for the same power consumption. Of course, there may be issues of multiple oscillation frequencies for which an additional bandpass filter may be required around the 1 GHz frequency term.

Comparison of SPR Phase Noise to Multi-Pole Resonator Phase Noise

The tuning range of oscillators composed of a single pole resonator (SPR) or a Multi-pole Resonator (MPR) were compared previously. Consider now the same SPR oscillator with a 3 dB Noise Figure gain block and a SPR of Q=10. The simplified Leeson's is $$\mathcal{L}(\Delta\omega) = 10\log\left(\frac{FkT}{2P_s}\left(\frac{\omega_o/\Delta\omega}{Q}\right)^2\right)$$

which yields a phase noise of −97 dBc/Hz.

Phase Noise of the MPR with Isolated Resonators

In this section, an example of the phase noise of an MPR will be discussed in detail, starting first with the MPR architecture of FIG. 10 where the resonators are isolated from each other.

Figure 21:
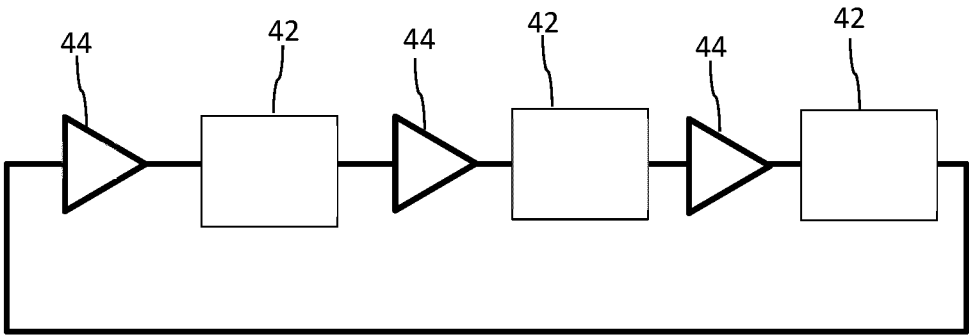
FIG. 21 is a schematic diagram of a multipole resonator with isolated resonators.

Referring to FIG. 21, consider a ring architecture of an example of an MPR 30 with alternating gain blocks 36 and resonators (SPR) 42. This will have a higher equivalent input phase noise because the gain block 36 is assumed to only compensate for the loss of the resonator. The Noise Figure is then $$\text{Noise Figure} = 10\log\left(3\left(F + \frac{G-1}{G}\right)\right)$$

Relating back to Leeson's, the phase noise will be the same as for a single resonator. Note that the $$\left|\frac{d\phi}{d\omega}\right|^2$$

is 9 times that of the SPR 42, and the noise figure is 3 times larger due to all three stages contributing equally and having statistically independent noise sources. Hence a key result that the phase noise of MPR 30 in FIG. 21 is reduced by 10 log(3) dB=4.8 dB relative to the phase noise of a SPR oscillator.

Phase Noise of the MPR with Coupled Resonators

The phase noise of the MPR may be further improved over the SPR by lumping the three isolated resonators 42 in FIG. 21 into a lumped MPR and replacing the three gain elements with a single element. Examples of the MPR that are applicable are the coupled resonators as seen in the three pole (FIG. 11)Error! Reference source not found. and two pole (FIG. 12) are used. A coupled two-pole resonator as shown in FIG. 22 will now be discussed.

Figure 22:
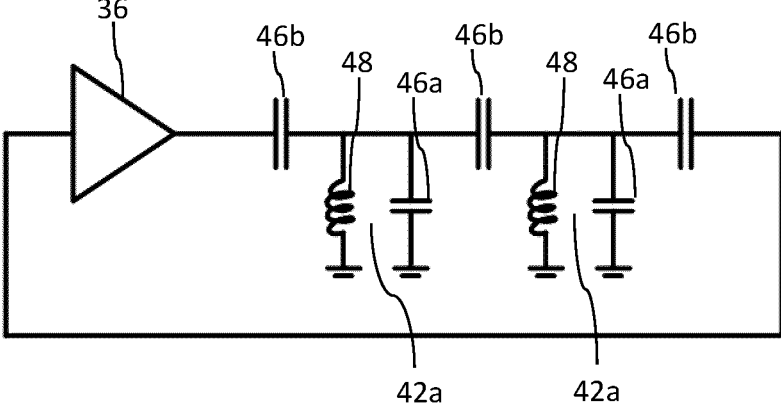
FIG. 22 is a schematic diagram of a low loss two pole coupled resonator.

In estimating the phase noise for FIG. 22, there may be a phase slope that is approximately twice that of the SPR. The NF of the gain block for the coupled two-pole resonator and the SPR should be about the same. Also, low loss coupling may be used such that the loss of resonator should not exceed about 2 dB. All else being equal, there will be about a 6 dB improvement in the phase noise over the SPR.

Quantitative Reduction in VCO Phase Noise Using an n-Pole MPR Compared to an SPR In summary, the following points have been discussed:

1. A multi-pole MPR resonator may provide a wide tuning range for the VCO compared to the single pole SDR
2. For a network of n resonators, the Q of the network may be more relevant than the Q of the individual poles
3. Leeson's phase relationship developed for a single pole resonator may be valid for a multi-pole resonator with the MPR Q being the relevant parameter
4. Q may be related to the phase noise slope via $$Q = \frac{\omega_o}{2}\left|\frac{d\phi}{d\omega}\right|$$

and thus with an increase in Q, the phase slope increases.

There will now be considered an example of a tunable VCO with some parasitic delay in the loop. This delay narrows the tuning range that is possible. By adding additional poles to the resonator, this tuning range may be broadened, and the phase noise may be reduced. An MPR having n poles may increase the phase slope near resonance $$\left|\frac{d\phi}{d\omega}\right|$$

over the SPR by a factor proportional to 20 log(n), and hence lower the VCO phase noise.

Figures 23, 24:
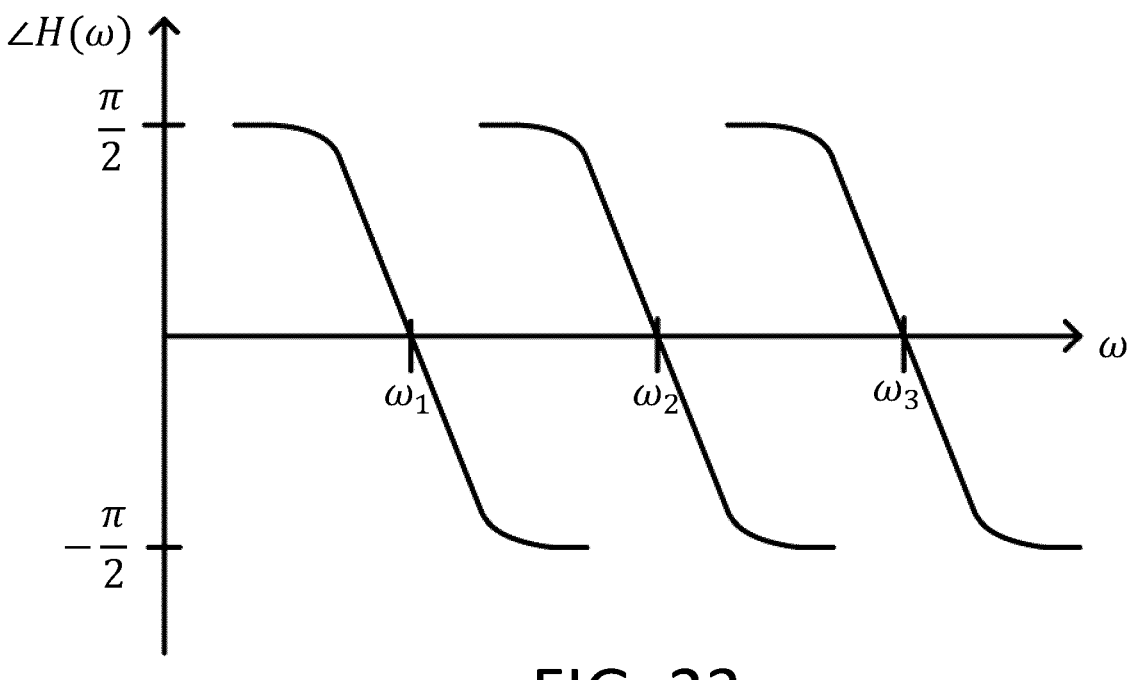
FIG. 23 is a plot of the phase of an open loop transfer function of an oscillator with a single pole resonator.
FIG. 24 is a plot of the phase of an open loop transfer function of an oscillator with a single pole resonator that has been affected by parasitic delay.

In FIG. 23, an SPR is phase aligned over the tuning band. Illustrated is the phase of the open loop transfer function H(jw), when tuned to three different frequencies of $w_1$, $w_2$ and $w_3$. The SPR is tuned to the desired carrier frequency by a varactor diode or other means. Ultimately, the tunability of this device limits the achievable tunable range of the VCO.

Now consider that the transfer function H(jw) may be associated with a parasitic delay that results in a phase shift that changes with frequency as illustrated in FIG. 24. The phase offsets due to the delay will lead to corrections needed in the varactor diode to achieve the correct frequency. However, as observed in the lower tuning end of this example, the phase slope is significantly less and therefore the phase noise will increase.

The problem is that at the offset phase that is required by the SPR to compensate for the phase of the delay in the loop, the phase slope $$\left|\frac{d\phi}{d\omega}\right|$$

decreases. This is evident for the $w_1$ curve. This causes the phase noise to increase for the tuning around $w_1$. If the VCO has a maximum phase noise specification, then it is evident that at the extremes of the tuning range that this may be exceeded primarily due to the drop in phase slope $$\left|\frac{d\phi}{d\omega}\right|.$$

This may limit the tuning range of the VCO. With a varactor diode there may be limitations of tuning that may limit the VCO tuning before the drop in $$\left|\frac{d\phi}{d\omega}\right|$$

becomes the limiting factor. However, wideband tuning VCOs may be with MEMS variable SPR structures or switched capacitors where the parasitic loop delay will limit the range.

Figure 25:
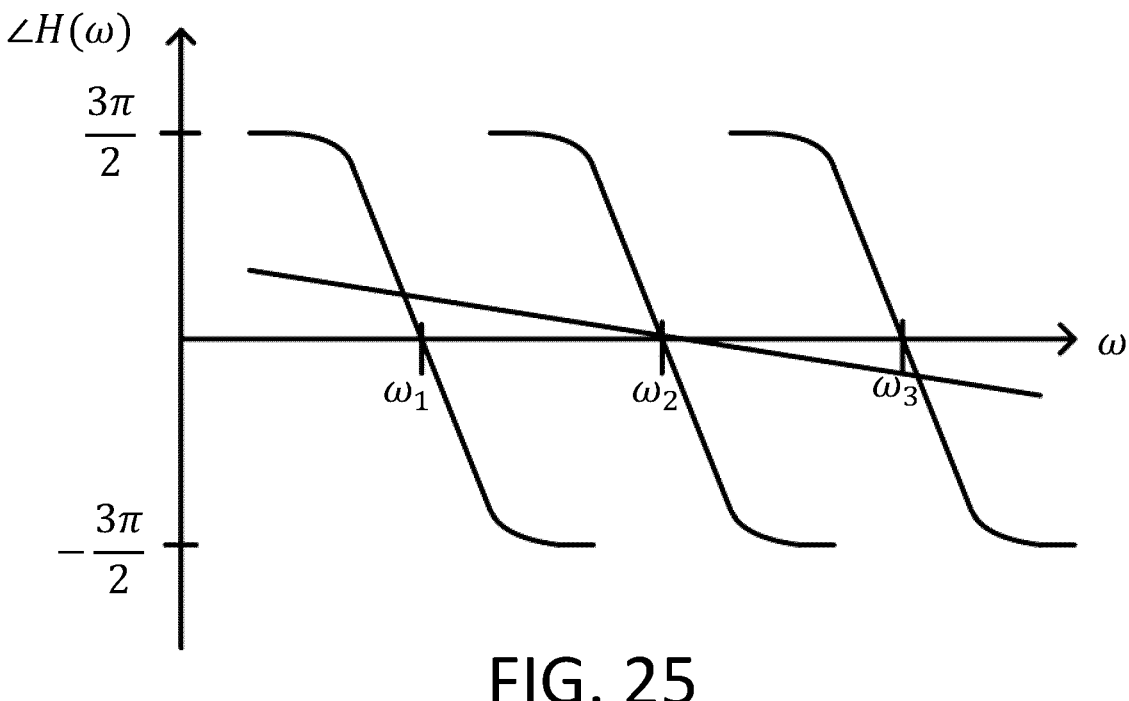
FIG. 25 is a plot of the phase of an open loop transfer function of an oscillator with a multipole resonator that has been affected by parasitic delay.

In comparison, consider the MPR consisting of three poles. The poles are arranged such that the MPR phase slope extends over the range of $-3\pi/2$ to $3\pi/2$. As depicted in FIG. 25 there may be less reduction in $$\left|\frac{d\phi}{d\omega}\right|$$

due to the phase offsets. Additionally $$\left|\frac{d\phi}{d\omega}\right|$$

is about three times larger for the MPR than the SPR, resulting in a significant improvement in phase noise of 20 log(3)dB=9.5 dB. This assumes that the losses of the H(s) for the SPR and the MPR are approximately equivalent.

Numerical Example of Tuning Range Extension with Phase Noise Reduction

A numerical example of this tuning range extension of the VCO is given by comparing the SPR with the MPR of two poles. As this is an illustrative comparison, the individual poles of the MPR will be assumed to be exactly the same as the single pole of the SPR. Start with a delay of $T_{dly}$ and assume phase matching at the center of the tuning range. For the n pole resonator, the phase is given as $$\phi = n\,\mathrm{atan}\!\left(\frac{\Delta\omega}{D\omega_o}\right)$$

Here $\Delta\omega$ is the offset in resonance frequency required to accommodate the delay phase offset. D is the damping coefficient of the pole and recall that Q=½D. Hence assuming the tuning is centered such that at the middle of the tuning band we have zero parasitic phase then the phase offset requirement is $$T_{dly}\omega_{tune} = n\,\mathrm{atan}\!\left(\frac{\Delta\omega}{D\omega_o}\right)$$

where $\omega_{tune}$ is the tuning frequency offset from the center of the tuning range. Hence, we can invert this as

15

$$\frac{\Delta\omega}{\omega_o} = D\tan\left(\frac{T_{dly}\omega_{tune}}{n}\right)$$

This gives the required resonator offset in terms of the normalized frequency offset. Note we can also write this in terms of the resonator Q as $$\frac{\Delta\omega}{\omega_o} = \frac{1}{2Q}\tan\left(\frac{T_{dly}\omega_{tune}}{n}\right)$$

Regardless of the form, we can directly observe that with n resonators we can:

1) Accommodate n times the loop delay for the same value of resonator loss,
2) Or for the same delay we can provide n times the tuning range, or
3) A combination of the two Additionally, for this case, the phase slope with respect to the offset frequency is given as $$\frac{d\phi}{d\Delta\omega} = \frac{n}{D\omega_o}\frac{1}{1+\left|\frac{\Delta\omega}{D\omega_o}\right|^2}$$

Which is proportional to n, again resulting in the 20 log(n) possible improvement in phase noise.

Figure 26:
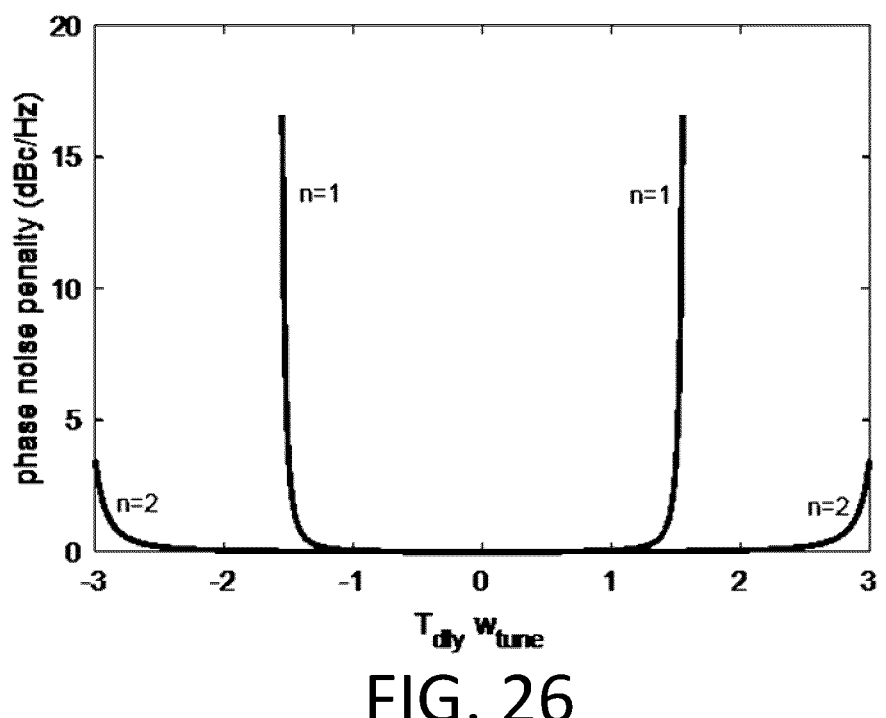
FIG. 26 is a plot of phase noise increase as a function of the combination of tuning frequency and phase delay.

Numerical results are shown in FIG. 26 for the n=1 (SPR) and n=2 (MPR). As observed, the phase noise increase is negligible for $|T_{dly}\,\omega_{tune}|<\pi/2$ but then becomes large as the phase slope heads to zero. For n=2 the tuning range can clearly be enhanced to about twice the tuning range of the SPR.

Generalizing, the tuning range may be shown to increase approximately by a factor of n times the SPR tuning range, where n is the number of dominant poles in the MPR.

Generally, in the MPR the individual tunable reactances may be tuned individually. For operation at a specific frequency these reactance settings may be optimized such that there is a maximum phase slope at the operating frequency. These optimal parameter settings may be stored in a LUT.

In an application of a set of discrete frequencies, the set of reactances would be optimized for each individual frequency and stored.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. An oscillator, comprising:
a feedback loop having a signal output, a multi-pole resonator, and a gain block, wherein, in operation:
the gain block operates in saturation and applies a gain sufficient to generate a stable oscillation signal at the signal output, the stable oscillation signal being continuously variable;

the multi-pole resonator selectably operates in two or more resonance modes; and
the two or more resonance modes are exclusively driven by a noise signal in the feedback loop.

2. The oscillator of claim 1, wherein the two or more resonance modes are frequency-tunable.

3. The oscillator of claim 2, wherein the two or more resonance modes are voltage- controlled.

4. The oscillator of claim 2, further comprising a controller comprising instructions to tune the two or more resonance modes to achieve a desired oscillation frequency.

5. The oscillator of claim 2, further comprising a controller comprising instructions to tune the two or more resonance modes to control a phase noise of the oscillator.

6. The oscillator of claim 1, wherein the multi-pole resonator comprises two or more resonators.

7. The oscillator of claim 6, wherein each resonator comprises a varactor or a set of switched capacitors.

8. The oscillator of claim 6, further comprising more than one gain block, at least one gain block separating adjacent resonators of the two or more of resonators.

9. The oscillator of claim 6, wherein at least two adjacent resonators of the two or more resonators are directly coupled.

10. The oscillator of claim 1, wherein the gain block operates in soft saturation.

11. A method of operating an oscillator, comprising the steps of:
providing an oscillator comprising a feedback loop having a signal output, a multi-pole resonator having two or more resonance modes, and a gain block, the two or more resonance modes being exclusively driven by a noise signal in the feedback loop;
producing a continuously variable signal having a desired oscillation frequency by:
operating the gain block in saturation and to apply a gain sufficient to generate a stable oscillation signal at the signal output; and
operating the multi-pole resonator in one of the two or more resonance modes.

12. The method of claim 11, wherein the multi-pole resonator is tunable between the two or more resonance modes.

13. The method of claim 12, wherein the two or more resonance modes are voltage-controlled.

14. The method of claim 12, further comprising the step of tuning the two or more resonance modes to achieve a desired oscillation frequency.

15. The method of claim 12, further comprising the step of tuning the two or more resonance modes to control a phase noise of the oscillator.

16. The method of claim 11, wherein the multi-pole resonator comprises two or more resonators.

17. The method of claim 16, wherein each resonator comprises a varactor or a set of switched capacitors.

18. The method of claim 16, further comprising more than one gain block, at least one gain block separating adjacent resonators of the two or more of resonators.

19. The method of claim 16, wherein at least two adjacent resonators of the two or more resonators are directly coupled.

20. The method of claim 11, wherein the gain block operates in soft saturation.

21. The method of claim 11, further comprising the step of tuning the resonance modes to tune the desired oscillation frequency.

22. The method of claim 11, further comprising the step of tuning the resonance modes to control a phase noise of the oscillator.

23. A method of designing an oscillator, comprising the steps of:

provding an oscillator comprising a feedback loop having a signal output, a multi-pole resonator, and a gain block, wherein the multi-pole resonator is selected to have two or more resonance modes, and the gain block is selected to be operable in saturation and to generate a stable oscillation signal at the signal output, and wherein the multi-pole resonator is selected as having two or more resonance modes that generate a continuously variable signal having a desired oscillation frequency, the two or more resonance modes being exclusively driven by a noise signal in the feedback loop.

24. The method of claim 23, wherein the multi-pole resonator is frequency-tunable between the two or more resonance modes.

25. The method of claim 24, wherein the two or more resonance modes are voltage-controlled.

26. The method of claim 23, wherein the two or more resonance modes are selected to provide a desired phase noise response of the oscillator.

27. The method of claim 23, wherein the multi-pole resonator comprises two or more resonators.

28. The method of claim 27, wherein each resonator comprises a varactor or a set of switched capacitors.

29. The method of claim 27, wherein the feedback loop further comprises more than one gain block, at least one gain block separating adjacent resonators of the two or more of resonators.

30. The method of claim 27, wherein at least two adjacent resonators of the two or more resonators are directly coupled.

31. The method of claim 23, wherein the gain block is operable in soft saturation.

* * * * *